US009785280B2

(12) United States Patent
Pang et al.

(10) Patent No.: US 9,785,280 B2
(45) Date of Patent: Oct. 10, 2017

(54) TOUCH DRIVING CIRCUIT, DISPLAY DEVICE AND DRIVING METHOD THEREOF (71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Fengchun Pang, Beijing (CN); Lei Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/121,897

(22) PCT Filed: Nov. 16, 2015

(86) PCT No.: PCT/CN2015/094725
§ 371 (c)(1),
(2) Date: Aug. 26, 2016

(87) PCT Pub. No.: WO2016/197542
PCT Pub. Date: Dec. 15, 2016

(65) Prior Publication Data
US 2017/0153742 A1 Jun. 1, 2017

(30) Foreign Application Priority Data
Jun. 10, 2015 (CN) .......................... 2015 1 0317080

(51) Int. Cl.
G06F 3/041 (2006.01)
G06F 3/044 (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...... G06F 3/0416; G06F 3/0412; G06F 3/044; G09G 3/2096; G09G 3/2092; G09G 2310/0286; G11C 19/28; G11C 19/184
See application file for complete search history.

(56) References Cited

U.S. PATENT DOCUMENTS

2008/0150871 A1* 6/2008 Park ..................... G09G 3/3607
345/98
2013/0293498 A1* 11/2013 Kim ..................... G06F 3/0412
345/173
(Continued)

FOREIGN PATENT DOCUMENTS

CN 103823589 A 5/2014
CN 103943055 A 7/2014
(Continued)

OTHER PUBLICATIONS

PCT/CN2015/094725, International Search Report, dated Mar. 7, 2016, 20 pages.

*Primary Examiner* — Richard Hong
(74) *Attorney, Agent, or Firm* — Armstrong Teasdale LLP (57) ABSTRACT The present disclosure provides a touch driving circuit for providing driving signals to touch driving electrodes of a touch panel in a touch phase. The touch driving circuit includes a plurality of cascaded touch shift register units. The number of the touch shift register units is same as the number of columns of the touch driving electrodes. The touch driving circuit further includes a plurality of switching units corresponding to the plurality of touch shift register units. The switching unit includes a driving signal input terminal, a control terminal and a driving signal output terminal. When the touch shift register unit outputs a high level signal, the switching unit connects the driving signal input terminal and the driving signal output terminal. Cor- (Continued)

respondingly, the present disclosure further provides a display device and a driving method thereof.

19 Claims, 4 Drawing Sheets

(51) Int. Cl.
    *G09G 3/20*     (2006.01)
    *G11C 19/28*     (2006.01)

(52) U.S. Cl.
    CPC ........... *G09G 3/2096* (2013.01); *G11C 19/28* (2013.01); *G09G 2310/0286* (2013.01)

(56) References Cited

U.S. PATENT DOCUMENTS

| | | | | |
|---|---|---|---|---|
| 2015/0277651 A1* | 10/2015 | Zhang | .................... | G06F 3/0416 |
| | | | | 345/173 |
| 2015/0302936 A1* | 10/2015 | Ma | ........................ | G11C 19/184 |
| | | | | 377/64 |
| 2016/0139719 A1* | 5/2016 | Liu | ........................ | G06F 3/0412 |
| | | | | 345/174 |
| 2016/0334908 A1* | 11/2016 | Zhuang | .................. | G06F 3/0412 |
| 2017/0132967 A1* | 5/2017 | Liu | ........................ | G09G 3/2092 |

FOREIGN PATENT DOCUMENTS

| | | |
|---|---|---|
| CN | 103996370 A | 8/2014 |
| CN | 104866141 A | 8/2015 |

* cited by examiner

TOUCH DRIVING CIRCUIT, DISPLAY DEVICE AND DRIVING METHOD THEREOF

CROSS REFERENCE TO RELATED APPLICATIONS

This application is a National Stage entry of PCT/CN2015/094725 filed Nov. 16, 2015, which claims the benefit and priority of Chinese Patent Application No. 201510317080.8, filed on Jun. 10, 2015, both of which in their entirety are incorporated by reference herein.

BACKGROUND

The present disclosure relates to the field of display technology, and particularly, to a touch driving circuit, a display device and a driving method for the display device.

Touch Screen Panels mainly include resistive, capacitive and infrared types, etc. Capacitive touch screen panels with high sensitivity are widely used. Capacitive touch screen panels mainly include out cell touch screen panels and in cell touch screen panels. For an out cell touch screen panel, a touch screen and a display screen are produced separately, and then affixed together with bezel or surface. For an in cell touch screen, a touch screen and a display screen are integrated together. The in cell touch screen is favored by major panel manufacturers due to light, thin, low-cost advantages.

Figure 1:
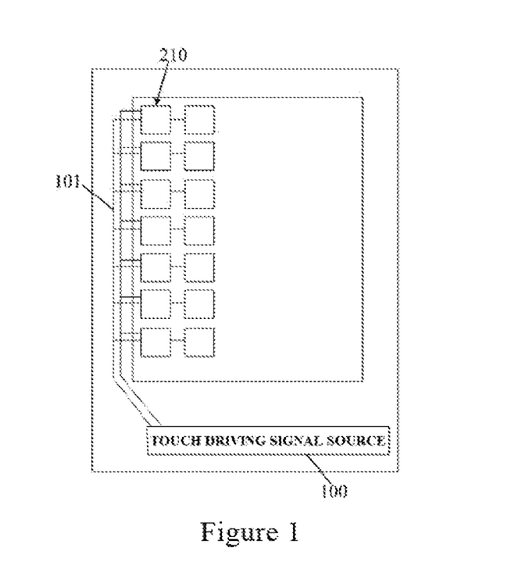
FIG. 1 is a schematic diagram of a conventional touch screen panel using therein a touch driving signal source to provide touch driving signals to touch driving electrodes.

FIG. 1 is a schematic diagram of a conventional touch screen panel using therein a touch driving signal source to provide touch driving signals to touch driving electrodes. As shown in FIG. 1, in a touch phase, a touch driving signal source 100 provides touch driving signals to a plurality of columns of touch driving electrodes 210 via a plurality of driving signal transmission lines 101, respectively. In a touch screen panel shown in FIG. 1, the driving signal transmission lines 101 will occupy certain bezel space. With the increase of the size of the display screen, the number of the driving signal transmission lines 101 is increased, leading to an increase in the occupied space, which limits the implementation of a narrow bezel.

BRIEF DESCRIPTION

Embodiments of the present disclosure provide a touch driving circuit, a display device including the touch driving circuit and a driving method of the display device, to implement a narrow bezel.

In a first aspect of the present disclosure, a touch driving circuit for providing driving signals to touch driving electrodes of a touch panel in a touch phase is provided. The touch driving circuit includes a plurality of cascaded touch shift register units, wherein the number of the touch shift register units is the same as the number of columns of the touch driving electrodes. The touch driving circuit further includes a plurality of switching units corresponding to the plurality of touch shift register units, wherein the switching unit includes a driving signal input terminal, a control terminal and a driving signal output terminal. The control terminal of the switching unit is connected to the output terminal of the corresponding touch shift register unit. The driving signal input terminal is connected to the touch driving signal source. The driving signal output terminal is connected to the corresponding column of the touch driving electrodes. When the touch shift register unit outputs a high level signal, the switching unit connects the driving signal input terminal and the driving signal output terminal.

In an embodiment of the present disclosure, the switching unit includes a first transistor. The gate of the first transistor forms the control terminal. A first electrode of the first transistor forms the driving signal output terminal. A second electrode of the first transistor forms the driving signal input terminal.

In an embodiment of the present disclosure, the touch driving circuit further includes a plurality of common signal output units corresponding to the plurality of touch shift register units. The input terminal of the common signal output unit is connected to a common signal source providing a common signal. The output terminal of the common signal output unit is connected to the driving signal output terminal of the switching unit. The common signal output unit is configured to connect the common signal source and the driving signal output terminal when the output terminal of the touch shift register unit outputs a low level signal.

In an embodiment of the present disclosure, the common signal output unit includes a second transistor and a third transistor. The gate of the second transistor is connected to a reset terminal of the touch shift register unit. A first electrode of the second transistor is connected to the driving signal output terminal. A second electrode of the second transistor is connected to the common signal source. The gate of the third transistor is connected to a display control signal terminal. A first electrode of the third transistor is connected to the driving signal output terminal. A second electrode of the third transistor is connected to the common signal source. The display control signal terminal is configured to provide a high level signal in a display phase.

In an embodiment of the present disclosure, the touch shift register unit includes a first clock signal terminal and a second clock signal terminal. Clock signals of the first clock signal terminal and of the second clock signal terminal are opposite in phase, and the second clock signal terminal is configured to provide a high level signal in the beginning period of displaying of a frame. The common signal output unit includes a second transistor. The gate of the second transistor is connected to the second clock signal terminal. A first electrode of the second transistor is connected to the driving signal output terminal. A second electrode of the second transistor is connected to the common signal source.

In an embodiment of the present disclosure, the touch shift register unit includes a first voltage input terminal, a second voltage input terminal, a fourth transistor, a fifth transistor, a pull-up module, a reset module and a pull-down module. The gate of the fourth transistor is connected to the input terminal of the touch shift register unit. The first electrode of the fourth transistor is connected to the first voltage input terminal. The connection point connecting the second electrode of the fourth transistor and the pull-up module forms a pull-up node. The gate of the fifth transistor is connected to the reset terminal of the touch shift register unit. The first electrode of the fifth transistor is connected to the pull-up node. The second electrode of the fifth transistor is connected to the second voltage input terminal. The pull-up module is connected to the first clock signal terminal, the pull-up node and the output terminal of the touch shift register unit, respectively. The pull-up module is configured to cause the output terminal of the touch shift register unit to output a high level signal in the pull-up period of operation of the touch shift register unit. The control terminal of the reset module is connected to the second clock signal terminal. The input terminal of the reset module is connected to a low level input terminal. The output terminal of the reset module is connected to the output terminal of the touch shift register unit. The reset module is configured to reset the output terminal of the touch shift register unit in a reset period of operation of the touch shift register unit. The pull-down module is connected to the second clock signal terminal, the pull-up node, the output terminal of the touch shift register unit and the low level input terminal, respectively. The pull-down module is configured to pull down potentials of the pull-up node and of the output terminal of the touch shift register unit in a pull-down retention period and a noise reduction period of operation of the touch shift register unit.

In an embodiment of the present disclosure, the pull-up module includes a sixth transistor and a capacitor. The gate of the sixth transistor is connected to the pull-up node. A first electrode of the sixth transistor is connected to the first clock signal terminal. The second electrode of the sixth transistor is connected to the output terminal of the touch shift register unit. A first electrode of the capacitor is connected to the pull-up node, and a second electrode of the capacitor is connected to the output terminal of the touch shift register unit.

In an embodiment of the present disclosure, the reset module includes a seventh transistor. The gate of the seventh transistor forms the control terminal of the reset module. A first electrode of the seventh transistor forms the output terminal of the reset module. A second electrode of the seventh transistor forms the input terminal of the reset module.

In an embodiment of the present disclosure, the pull-down module includes an eighth transistor, a ninth transistor, a tenth transistor, an eleventh transistor, a twelfth transistor and a thirteenth transistor. The gate and first electrode of the eighth transistor are both connected to the second clock signal terminal. A second electrode of the eighth transistor is connected to the gate of the ninth transistor. A first electrode of the ninth transistor is connected to the second clock signal terminal. The connection point connecting a second electrode of the ninth transistor, the gate of the tenth transistor, a first electrode of the twelfth transistor and the gate of the thirteenth transistor forms the pull-down node. A first electrode of the tenth transistor is connected to the pull-up node. A second electrode of the tenth transistor is connected to the low level input terminal. The gate of the eleventh transistor is connected to the pull-up node. A first electrode of the eleventh transistor is connected to the second electrode of the eighth transistor. A second electrode of the eleventh transistor is connected to the low level input terminal. The gate of the twelfth transistor is connected to the pull-up node. A second electrode of the twelfth transistor is connected to the low level input terminal. A first electrode of the thirteenth transistor is connected to the output terminal of the touch shift register unit. A second electrode of the thirteenth transistor is connected to the low level input terminal.

In an embodiment of the present disclosure, the first one of the touch shift register units further includes a loop input module and a touch OFF module. The control terminal of the loop input module is connected to the output terminal of the last one of the touch shift register units. The output terminal of the loop input module is connected to the pull-up node of the first one of the touch shift register units. The loop input module is configured to charge the pull-up module of the first one of the touch shift register units according to the output voltage of the last one of the touch shift register units. The touch OFF module is configured to cause the first one of the touch shift register units to output a low level signal in the display phase.

In an embodiment of the present disclosure, the loop input module includes a fourteenth transistor. The gate of the fourteenth transistor is connected to the output terminal of the last one of the touch shift register units. A first electrode of the fourteenth transistor is connected to the first voltage input terminal at which a high level signal is inputted. A second electrode of the fourteenth transistor is connected to the pull-up node of the first one of the touch shift register units.

In an embodiment of the present disclosure, the control terminal of the touch OFF module is connected to a frame beginning signal terminal. The frame beginning signal terminal is configured to provide a high level signal in the beginning period of displaying of a frame. The output terminal of the touch OFF module is connected to the pull-up node of the first one of the touch shift register units. The input terminal of the touch OFF module is connected to the second voltage input terminal. The second voltage input terminal is inputted with a low level signal. The touch OFF module connects the pull-up node and the second voltage input terminal in the display phase.

In an embodiment of the present disclosure, the touch OFF module includes a fifteenth transistor. The gate of the fifteenth transistor forms the control terminal of the touch OFF module. A first electrode of the fifteenth transistor forms the output terminal of the touch OFF module. A second electrode of the fifteenth transistor forms the input terminal of the touch OFF module.

In another aspect of the present disclosure, a display device including a gate driving circuit, a touch driving circuit and a touch panel is provided. The touch driving circuit is the above-described touch driving circuit provided by the present disclosure. The gate driving circuit includes a plurality of cascaded display shift register units. The output terminal of the last one of the display shift register units is connected to the input terminal of the first one of the touch shift register units of the touch driving circuit.

In an embodiment of the present disclosure, the touch panel includes a common electrode bar. The extending direction of the common electrode bar and the extending direction of the touch driving electrodes intersect. Moreover, the common electrode bar and the touch driving electrodes are insulated from one another. Each column of touch driving electrodes includes a plurality of touch driving electrode blocks. The touch driving electrode blocks and the common electrode bar are provided in the same layer.

In still another aspect of the present disclosure, a driving method of the display device is provided. The driving method includes when the display device performs image displaying, the plurality of display shift register units sequentially scanning gate lines corresponding to the plurality of display shift register units in the display phase of each frame, so as to display the frame. Moreover, in a touch phase of each frame, the touch driving signal source concurrently provides touch driving signals to driving signal input terminals of the plurality of switching units, and when the plurality of touch shift register units sequentially output high level signals, the respective switching units corresponding to the plurality of touch shift register units provide the touch driving signals to the corresponding touch driving electrodes.

In an embodiment of the present disclosure, the switching unit includes a first transistor, the gate of the first transistor forms the control terminal, a first electrode of the first transistor forms the touch driving signal output terminal, a second electrode of the first transistor forms the touch driving signal input terminal. In the touch driving method, in the touch phase of each frame, when the corresponding touch shift register unit outputs a high level signal, a first electrode and a second electrode of the first transistor are connected.

In an embodiment of the present disclosure, the touch driving circuit further includes a plurality of common signal output units corresponding to the plurality of touch shift register units. The input terminal of the common signal output unit is connected to the common signal source. The output terminal of the common signal output unit is connected to the driving signal output terminal. The touch driving method further includes controlling the common signal source to continuously output a common signal, and when the output terminal of the touch shift register unit outputs a low level, controlling the input terminal and output terminal of the common signal output unit to be connected.

In an embodiment of the present disclosure, the common signal output unit includes a second transistor and a third transistor. The gate of the second transistor is connected to the reset terminal of the touch shift register unit. A first electrode of the second transistor forms the output terminal of the common signal output unit and is connected to the driving signal output terminal. A second electrode of the second transistor forms the input terminal of the common signal output unit and is connected to the common signal source. The gate of the third transistor is connected to the display control signal terminal. A first electrode of the third transistor is connected to the driving signal output terminal. A second electrode of the third transistor is connected to the common signal source. The touch driving method further includes: in the display phase, providing a high level signal to the display control signal terminal.

In an embodiment of the present disclosure, the touch shift register unit includes a first clock signal terminal and a second clock signal terminal. The common signal output unit includes a second transistor. The gate of the second transistor is connected to the second clock signal terminal. The first electrode of the second transistor forms the output terminal of the common signal output unit and is connected to the driving signal output terminal. The second electrode of the second transistor forms the input terminal of the common signal output unit and is connected to the common signal source. And the driving method further includes providing clock signals opposite in phase to the first clock signal terminal and the second clock signal terminal, and in the pull-up period of operation of the touch shift register unit, providing a low level signal to the second clock signal terminal.

In the embodiments of the present disclosure, since the touch driving circuit includes a plurality of cascaded touch shift register units and a plurality of switching units corresponding to the plurality of touch shift register units, the plurality of cascaded touch shift register units may sequentially output a high level signal, and when a certain-level touch shift register unit outputs a high level signal, the driving signal input terminal of the switching unit and the driving signal output terminal are connected, thereby outputting the touch driving signal to the touch driving electrodes corresponding to the touch shift register unit. Therefore, there is only a need to connect the touch driving signal source and the driving signal input terminals of the plurality of switching units via a driving signal transmission line, and then the touch driving signal is sequentially output to the plurality of touch driving electrodes under the shift action of the touch shift register units. Compared to the way in the prior art in which each of the touch driving electrodes is provided with a touch driving signal via a driving signal transmission line, the present disclosure reduces the use of the driving signal transmission lines, thereby reducing the space occupied by the driving signal transmission lines, and facilitating the implementation of a narrow bezel.

BRIEF DESCRIPTION OF THE DRAWINGS

In order to more clearly illustrate the technical solution of embodiments of the present disclosure, the drawings of the embodiments will be briefly described below, and it should be aware that the drawings described below relate only to some embodiments of the present disclosure, rather than limit the disclosure, wherein.

DETAILED DESCRIPTION

To make the technical solution and advantages of embodiments of the present disclosure clearer, the technical solution of the embodiments of the present disclosure will be described below clearly and completely in conjunction with the drawings. The described embodiments are part of but not all of embodiments of the present disclosure. Based on the embodiments of the present disclosure described, all other embodiments obtained by those skilled in the art without creative work also fall within the scope of the present disclosure sought for protection.

Figure 2:
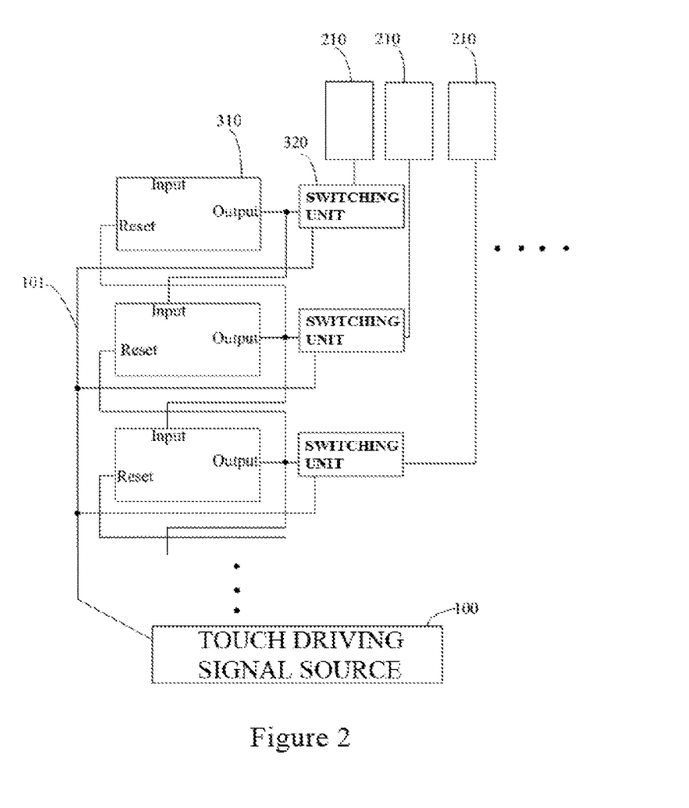
FIG. 2 is a schematic structural diagram of a touch driving circuit according to an embodiment of the present disclosure.

FIG. 2 is a schematic structural diagram of a touch driving circuit according to an embodiment of the present disclosure. The touch driving circuit of the present embodiment may provide a driving signal to a touch driving electrode of a touch panel in a touch phase. As shown in FIG. 2, the touch driving circuit includes a plurality of cascaded touch shift register units 310. The number of the touch shift register units 310 is the same as the number of columns of touch driving electrodes 210. The touch driving circuit further includes a plurality of switching units 320 corresponding to the plurality of touch shift register units 310.

In an embodiment of the present disclosure, each touch shift register unit 310 includes an input terminal Input, a reset terminal Reset, and an output terminal Output. In every three levels touch shift register units 310, the output terminal Output of the second-level touch shift register unit is connected with the reset terminal Reset of the first one of the touch shift register units and the input terminal Input of the third-level touch shift register unit, respectively. The plurality of cascaded touch shift register units sequentially output high level signals at the output terminal Output.

Figure 3:
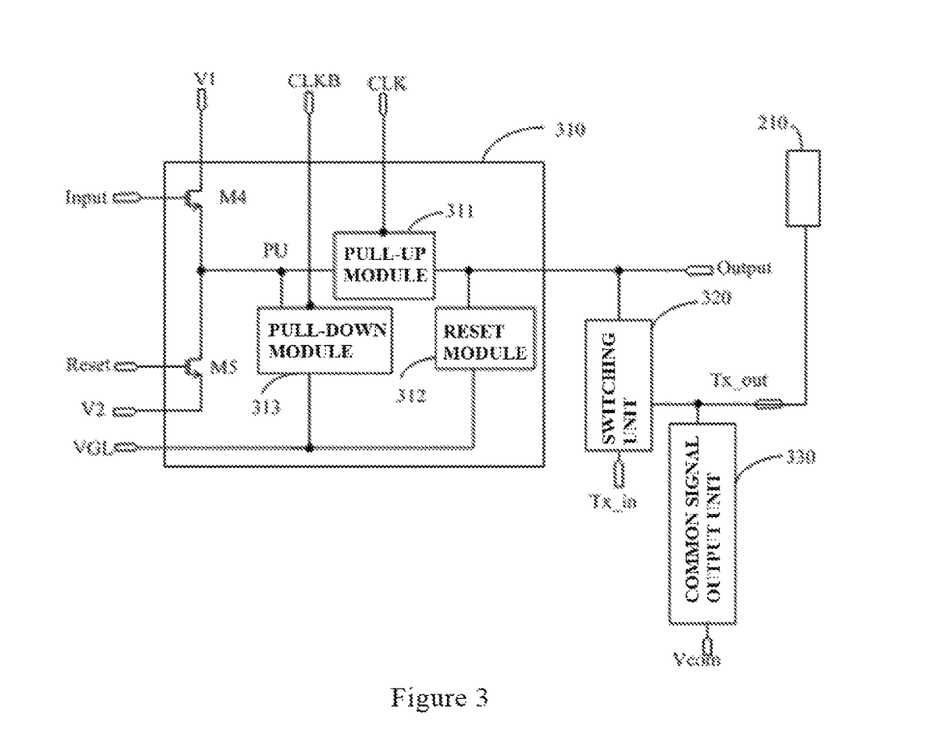
FIG. 3 is a schematic diagram for explaining a touch shift register unit in the embodiment shown in FIG. 2.

FIG. 3 is a schematic diagram for explaining a touch shift register unit in the embodiment shown in FIG. 2. As shown in FIG. 3, in the embodiment of the present disclosure, the touch shift register unit 310 includes a first voltage input terminal V1, a second voltage input terminal V2, a fourth transistor M4, a fifth transistor M5, a pull-up module 311, a reset module 312 and a pull-down module 313. The gate of the fourth transistor M4 is connected to the input terminal of the touch shift register unit 310, a first electrode of the fourth transistor M4 is connected to the first voltage input terminal V1, and the connection point connecting a second electrode of the fourth transistor M4 and the pull-up module 311 forms a pull-up node PU. The gate of the fifth transistor M5 is connected to the reset terminal Reset of the touch shift register unit 310, a first electrode of the fifth transistor M5 is connected to the pull-up node PU of the pull-up module 311, and a second electrode of the fifth transistor M5 is connected to the second voltage input terminal V2.

In an embodiment of the present disclosure, the first voltage input terminal V1 can be inputted with a high level signal, the second voltage input terminal V2 can be inputted with a low level signal. In this case, the fourth transistor M4 connects the first voltage input terminal V1 and the pull-up node PU in a precharge period of operation of the touch shift register unit 310 so as to pull up the potential of the pull-up node. The fifth transistor M5 connects the pull-up node PU and the second voltage input terminal V2 in a reset period of operation of the touch shift register unit 310 so as to reset the pull-up node PU. Alternatively, the first voltage input terminal V1 can be inputted with a low level signal, and the second voltage input terminal V2 can be inputted with a high level signal. In this case, the fifth transistor M5 connects the second voltage input terminal V2 and the pull-up node PU in a precharge period of operation of the touch shift register unit 310 so as to pull up the potential of the pull-up node. The fourth transistor M4 connects the first voltage input terminal V1 and the pull-up node PU in a reset period of operation of the touch shift register unit 310 so as to reset the pull-up node PU. Thus, when the first voltage input terminal V1 is inputted with a high level signal and the second voltage input terminal V2 is inputted with a low level signal, forward scanning of the plurality of touch shift register units may be implemented. When the first voltage input terminal V1 is inputted with a low level signal and the second voltage input terminal V2 is inputted with a high level signal, reverse scanning of the plurality of touch shift register units may be implemented.

The pull-up module 311 is connected with a first clock signal terminal CLK, the pull-up node PU and the output terminal Output of the touch shift register unit, respectively. The pull-touch module 311 causes the output terminal Output of the touch shift register unit to output a high level signal in a pull-up period of operation of the touch shift register unit 310.

The control terminal of the reset module 312 is connected to the second clock signal terminal CLKB, the input terminal of the reset module 312 is connected to a low level input terminal VGL, and the output terminal of the reset module 312 is connected to the output terminal Output of the touch shift register unit. The reset module 312 resets the output terminal Output of the touch shift register unit in a reset period of operation of the touch shift register unit 310.

The pull-down module 313 is connected to the second clock signal terminal CLKB, the pull-up node PU, the output terminal Output of the touch shift register unit and the low level input terminal VGL. The pull-down module 313 pulls down the potentials of the pull-up node PU and the output terminal Output of the touch shift register unit in a pull-down retention period and a noise reduction period of operation of the touch shift register unit.

As shown in FIG. 3, the switching unit 320 may include a driving signal input terminal Tx_in, a control terminal and a driving signal output terminal Tx_out. The control terminal of the switching unit 320 is connected to the output terminal of the corresponding touch shift register unit 310. The driving signal input terminal Tx_in is connected to a touch driving signal source 100, and specifically the touch driving signal source 100 may be connected to the driving signal input terminal Tx_in via a driving signal transmission line 101. The driving signal output terminal Tx_out is connected to a corresponding column of touch driving electrodes 210. When the touch shift register unit 310 outputs a high level signal, the switching unit 320 connects the driving signal input terminal Tx_in and the driving signal output terminal Tx_out, so that a touch driving signal of the touch driving signal source 100 is outputted to the corresponding touch driving electrodes 210.

As shown in FIG. 3, in an embodiment of the present disclosure, compared with the embodiment shown in FIG. 2, the touch driving circuit may further include a plurality of common signal output units 330 corresponding to the plurality of touch shift units 310. The input terminal Vcom of the common signal output unit 330 is connected to the common signal source for providing a common signal. The output terminal of the common signal output unit 330 is connected to the driving signal output terminal Tx_out of the switching unit 320. And the common signal output unit 330 is used for connecting the common signal source and the driving signal output terminal Tx_out when the output terminal of the touch shift register unit 310 outputs a low level signal, so that the common signal of the common signal source is output to the touch driving electrodes.

As shown in FIGS. 2 and 3, in the embodiments of the present disclosure, since the touch driving circuit includes the plurality of cascaded shift register units 310 and the plurality of switching units 320 corresponding to the plurality of touch shift register units 310. The plurality of cascaded touch shift register units 310 may sequentially output high level signals, when a certain-level touch shift register unit 310 outputs a high level signal, the driving signal input terminal Tx_in of the corresponding switching unit 320 and the driving signal output terminal Tx_out are connected to output the touch driving signal to the touch driving electrodes 210 corresponding to the touch shift register unit 310. Therefore, there is only a need to connect the touch driving signal source 100 and the driving signal input terminals Tx_in of the plurality of switching units via a driving signal transmission line 101, and then the touch driving signal may be sequentially output to the plurality of touch driving electrodes 210 under the shift action of the touch shift register units. Compared to the way in the prior art in which each of the touch driving electrodes is provided with a touch driving signal via a driving signal transmission line, the present embodiment reduces the use of the driving signal transmission lines, thereby reducing the space occupied by the driving signal transmission lines, facilitating the implementation of a narrow bezel and saving costs.

Figure 4:
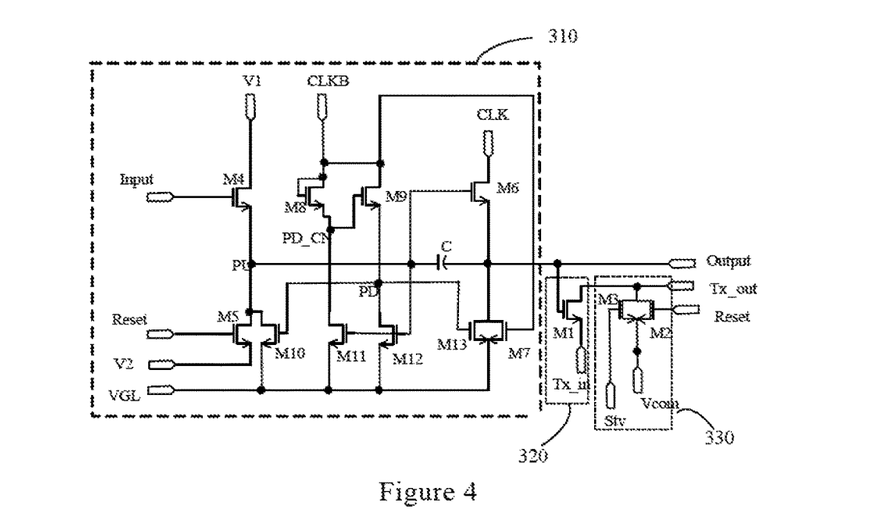
FIG. 4 is a first schematic circuit diagram for explaining the structures of the touch shift register unit, a switching unit, and a common signal output unit in the embodiment shown in FIG. 2.

FIG. 4 is a first schematic circuit diagram for explaining the structures of the touch shift register unit, the switching unit and the common signal output unit in the embodiment shown in FIG. 2. As shown in FIG. 4, specifically, in the touch shift register unit 310, the pull-up module 311 may include a sixth transistor M6 and a capacitor C. The gate of the sixth transistor M6 is connected to the pull-up node PU, a first electrode of the sixth transistor M6 is connected to the first clock signal terminal CLK, and a second electrode of the sixth transistor M6 is connected to the output terminal Output of the touch shift register unit. A first electrode of the capacitor C is connected to the pull-up node PU, and a second electrode of the capacitor C is connected to the output terminal Output of the touch shift register unit.

The reset module 312 may include a seventh transistor M7. The gate of the seventh transistor M7 forms the control terminal of the reset module 312, and is connected to the second clock signal terminal CLKB. A first electrode of the seventh transistor M7 forms the output terminal of the reset module 312, and is connected to the output terminal Output of the touch shift register unit. A second electrode of the seventh transistor M7 forms the input terminal of the reset module 312, and is connected to a low level input terminal VGL. In the reset period, the second clock signal terminal CLKB is inputted with a high level signal. The seventh transistor M7 is turned on to connect the output terminal Output of the touch shift register unit and the low level input terminal VGL so as to implement the rest of the output terminal Output of the touch shift register unit.

The pull-down module 313 may include an eighth transistor M8, a ninth transistor M9, a tenth transistor M10, an eleventh transistor M11, a twelfth transistor M12 and a thirteenth transistor M13. The gate and first electrode of the eighth transistor M8 are connected to the second clock signal terminal CLKB, and a second electrode of the eighth transistor M8 is connected to the gate of the ninth transistor M9. A first electrode of the ninth transistor M9 is connected to the second clock signal terminal CLKB, and the connection point connecting the second electrode of the ninth transistor M9 and the gate of the tenth transistor, the first electrode of the twelfth transistor, and the gate of the thirteenth transistor forms a pull-down node PD. A first electrode of the tenth transistor M10 is connected to the pull-up node PU, and the second electrode of the tenth transistor M10 is connected to a low level input terminal VGL. The gate of the eleventh transistor M11 is connected to the pull-up node PU, a first electrode of the eleventh transistor M11 is connected to the second electrode of the eighth transistor M8, and a second electrode of the eleventh transistor M11 is connected to the low level input terminal VGL. The gate of the twelfth transistor M12 is connected to the pull-up node PU, and a second electrode of the twelfth transistor M12 is connected to the low level input terminal VGL. A first electrode of the thirteenth transistor M13 is connected to the output terminal Output of the touch shift register unit, and a second electrode of the thirteenth transistor M13 is connected to the low-level input terminal VGL.

The switching unit 320 may include a first transistor M1, wherein the gate of the first transistor M1 forms the control terminal, so as to be connected to the output terminal Output of the corresponding touch shift register unit 310. A first electrode of the first transistor M1 forms the driving signal output terminal Tx_out, so as to be connected to the corresponding touch driving electrode 210, and the second electrode of the first transistor M1 forms the driving signal input terminal Tx_in. When the output terminal of a certain-level touch shift register unit 310 outputs a high level, the first and second electrodes of the first transistor M1 are connected, so that the touch driving signal of the touch driving signal source 100 is outputted to the touch driving electrode 210 corresponding to the touch shift register unit 310 via the first transistor M1.

The common signal output unit 330 may include a second transistor M2 and a third transistor M3. The gate of the second transistor M2 is connected to the reset terminal Reset of the touch shift register unit 310, the first electrode of the second transistor M2 is connected to the driving signal output terminal, and the second electrode of the second transistor M2 is connected to the common signal source. The gate of the third transistor M3 is connected to the display control signal terminal, the first electrode of the third transistor M3 is connected to the driving signal output terminal, and the second electrode of the third transistor M3 is connected to the common signal source. The display control signal terminal is used for providing a high level signal in a display phase of a frame so as to turn on the third transistor M3 in the display phase.

Figure 5:
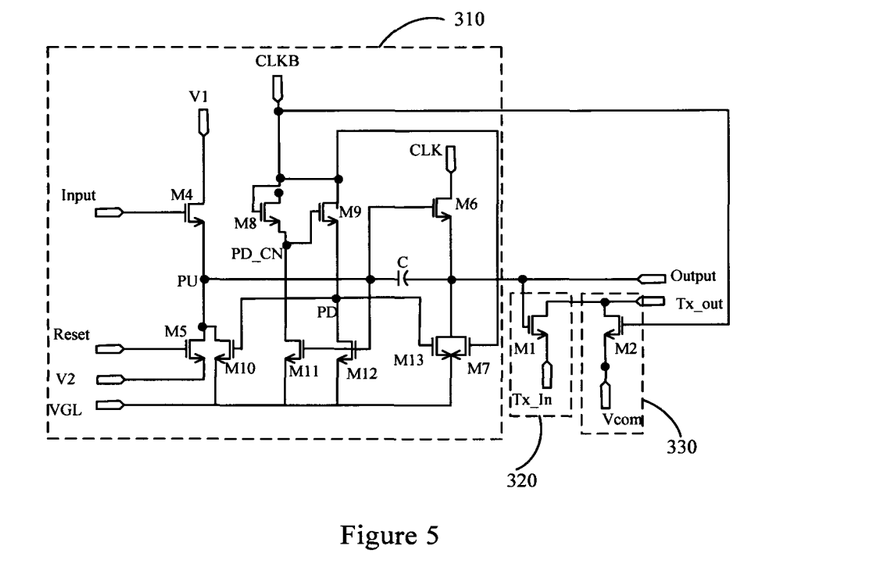
FIG. 5 is a second schematic circuit diagram for explaining the structures of the touch shift register unit, the switching unit, and the common signal output unit in the embodiment shown in FIG. 2.

FIG. 5 is a second schematic circuit diagram for explaining the structures of the touch shift register unit, the switching unit and the common signal output unit in the embodiment shown in FIG. 2. In an embodiment of the present disclosure, there are following differences from the schematic circuit diagram shown in FIG. 4. As shown in FIG. 5, clock signals of the first clock signal terminal CLK and of the second clock signal terminal CLKB may be opposite in phase, and the second clock signal terminal CLKB provides a high level signal in the beginning period of the display phase of a frame. The common signal output unit 330 includes a second transistor M2. The gate of the second transistor M2 is connected to the second clock signal terminal CLKB, and the first electrode of the second transistor M2 is connected to the driving signal output terminal, the second electrode of the second transistor M2 is connected to the common signal source. The second clock signal terminal CLKB provides a high level signal in the beginning period, i.e., provides a high level signal in the precharge period and the reset period of operation of each touch shift register unit 310. Thus, when each touch shift register unit 310 outputs a low level signal in the reset period, the high level signal provided at the second clock signal terminal CLKB turns on the second transistor M2, and the common signal of the common signal source is outputted via the second transistor M2 to the touch driving electrode. This arrangement does not need extra signal lines, thereby simplifying the structure of the common signal output unit.

Figure 6:
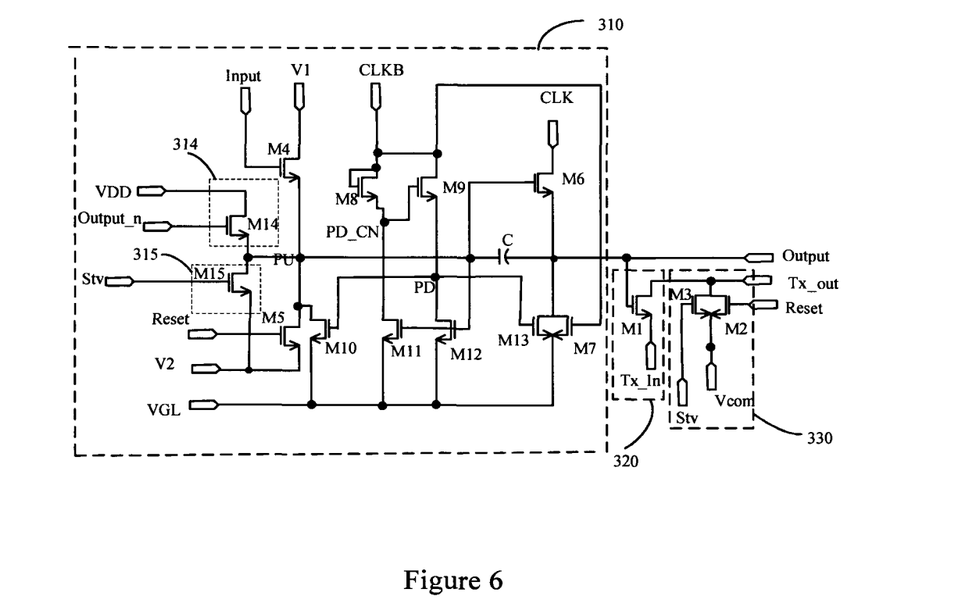
FIG. 6 is a schematic circuit diagram for explaining the structure of the first one of the touch shift register units in the embodiment shown in FIG. 2.

FIG. 6 is a schematic circuit diagram for explaining the structure of the first one of the touch shift register units in the embodiment shown in FIG. 2. As shown in FIG. 6, in the embodiment of the present disclosure, in addition to the same parts as the schematic circuit diagram shown in FIG. 4, the first one of the touch shift register units 310 may further include a loop input module 314 and a touch OFF module 315.

The control terminal of the loop input module 314 is connected to the output terminal of the last one of the touch shift register units 310. The output terminal of the loop input module 314 is connected to the pull-up node PU of the first one of the shift register touch units 310, and charges the pull-up module of the first one of the touch shift register units according to the output voltage of the last one of the touch shift register units 310.

In an embodiment of the present disclosure, for example, the loop input module 314 includes a fourteenth transistor M14. The gate of the fourteenth transistor M14 is connected to the output terminal of the last one of the touch shift register units 310, and a first electrode of the fourteenth transistor M14 is connected to the first voltage input terminal V1. The first voltage input terminal V1 is inputted with a high level signal, and a second electrode of the fourteenth transistor M14 is connected to the pull-up node PU of the first one of the touch shift register units. When the output terminal of the last one of the touch shift register units outputs a high level, the fourteenth transistor M14 of the first one of the touch shift register units is turned on, and the first voltage input terminal V1 and the pull-up node PU are turned on to pull up the potential of the pull-up node PU to a high potential. Thus, when the first clock signal terminal CLK is inputted with a high level signal in the pull-up period, the output terminal of the first one of the touch shift register units outputs a high level signal.

Thus, the plurality of touch shift register units sequentially outputs high level signals, so that the touch driving signal source sequentially outputs high level signals to the plurality of touch driving electrodes. When the last one of the touch shift register units outputs a high level signal, the touch driving signal source provides a touch driving signal to the corresponding touch driving electrodes, and meanwhile the loop input module 314 charges the pull-up module of the first one of the touch shift register units, and pulls the potential of the pull-up node PU up to a high level potential, that is, the first one of the touch shift register units enters into a precharge period. Therefore, after the touch driving signal source provides the touch driving signal to the touch driving electrodes corresponding to the last one of the touch shift register units, it begins to provide a touch driving signal to the touch driving electrodes corresponding to the first one of the touch shift register units again, thereby implementing the loop driving.

For example, in an embodiment of the present disclosure, the touch OFF module 315 includes a fifteenth transistor M15. The gate of the fifteenth transistor M15 forms the control terminal of the touch OFF module 315 and is connected to the frame beginning signal terminal STV. A first electrode of the fifteenth transistor M15 forms the output terminal of the touch OFF module 315, and is connected to the pull-up node PU. The second electrode of the fifteenth transistor M15 forms the input terminal of the touch OFF module 315, and is connected to the second voltage input terminal V2. The touch driving signal source cyclically inputs touch driving signals to the plurality of touch driving electrodes. Until the beginning of the display phase of the next frame, the fifteenth transistor M15 is turned on, and the potential of the pull-up node PU is pulled down to a low level potential, to cause the output terminal of the first one of the touch shift register units to output a low level signal, so that the plurality of touch shift register units sequentially outputs low level signals, and the common signal source outputs a common signal to the plurality of touch driving electrodes for image displaying.

In the beginning of the display phase, the touch OFF module 315 causes the first one of the touch shift register units to output a low level signal such that the touch driving signal source 100 no longer provides a touch driving signal to the touch driving electrodes. The terminal module of the touch OFF control 315 is connected to the frame beginning signal terminal STV. The frame beginning signal terminal STV provides a high level signal in the beginning period of displaying of a frame (i.e., the beginning period of the displaying phase). The output terminal of the touch OFF module 315 is connected to the pull-up node PU of the first one of the touch shift register units, and the input terminal of the touch OFF module 315 is connected to the second voltage input terminal V2. The second voltage input terminal V2 is inputted with a low level signal. In the display phase, the pull-up node PU and the second voltage input terminal V2 are connected, so that the output terminal Output of the touch shift register unit 310 outputs a low level signal in the display phase.

Figure 7:
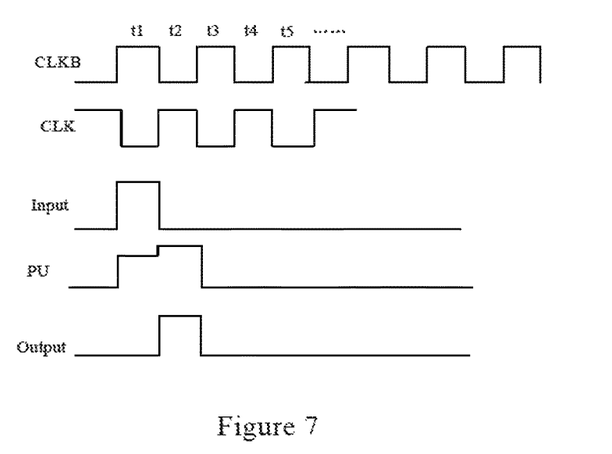
FIG. 7 is a signal timing diagram of the touch shift register unit of the embodiment of the present disclosure.

FIG. 7 is a signal timing diagram of the touch shift register unit of the embodiment of the present disclosure. As shown in FIG. 7, in the embodiment of the present disclosure, for any touch shift register unit 310, its operation phases include sequentially a precharge period, a pull-up period, a reset period, a pull-down retention period and a noise reduction period.

The operation processes of the touch shift register unit 310 will be described below by example of the first voltage input terminal V1 inputting a high level signal and the second voltage input terminal V2 inputting a low level signal.

In the precharge period (such as the t1 period in FIG. 7), the input terminal Input of the touch shift register unit 310 is inputted with a high level signal, and the output terminal Output of the touch shift register unit 310 outputs a low level signal. Specifically, the first clock signal terminal CLK is inputted with a low level signal, the second clock signal terminal CLKB is inputted with a high level signal, and the input terminal Input is inputted with a high level signal. Thus, the fourth transistor M4 is turned on, and the first voltage input terminal V1 charges the capacitor C to pull up the potential of the pull-up node PU. Meanwhile, the seventh transistor M7 is turned on to the pull down the potential of the output terminal Output. In addition, the eighth transistor M8 is turned on to pull the potential of the pull-down control node PD_CN up to a high level potential, so that the ninth transistor M9 is turned on to pull the potential of the pull-down node PD to a high level potential. However, since the pull-up node PU is pulled up to a high level potential, the eleventh transistor M11 and the twelfth transistor M12 are turned on so as to pull down the potentials of the pull-down control node PD_CN and of the pull-down node PD to low potentials. In summary, in the precharge period, the output terminal Output of the touch shift register unit outputs a low level signal.

In the pull-up period (such as the t2 period shown in FIG. 7), the output terminal Output of the touch shift register unit outputs a high level signal. Specifically, the first clock signal input terminal CLK is inputted with a high level signal, the second clock signal terminal CLKB is inputted with a low level signal. Because of the bootstrap effect of the capacitor C, the potential of the pull-up node PU is further pulled up high. The sixth transistor M6 is turned on, the seventh transistor M7 is turned off, and the output terminal Output of the touch shift register unit outputs a high level signal.

In the reset period (such as the t3 period in FIG. 7), the potential of the pull-up node PU is pulled down to a low level potential, the output terminal Output of the touch shift register unit outputs a low level signal. Specifically, the first clock signal terminal CLK is inputted with a low level signal, the second clock signal terminal CLKB is inputted with a high level signal, and the reset terminal Reset of the touch shift register unit is inputted with a high level signal. Thus, the fifth transistor M5 is turned on, and the pull-up node PU and the second voltage input terminal V2 are connected, so that the potential of the pull-up node PU is pulled down to a low level, and the seventh transistor M7 is turned on, and the output terminal Output of the touch shift register unit outputs a low level signal. Further, the eighth transistor M8 is turned on, and the potential of the pull-down node PD_CN is pulled up to a high level. Therefore, the ninth transistor M9 is turned on, and the potential of the pull-down node PD is pulled up to a high level, so that the tenth transistor M10 and the thirteenth transistor M13 are turned on. The pull-up node PU and the output terminal Output of the touch shift register unit are connected with the low level input terminal to ensure that the output terminal Output of the touch shift register unit outputs a low level signal.

In the pull-down retention period (such as the t4 period in FIG. 7), the first clock signal terminal CLK is inputted with a high level signal, and the second clock signal terminal CLKB is inputted with a low level signal. The eighth transistor M8 is turned off, and the pull-down control node PD_CN and the pull-down node PD remain high levels in the reset period. Thus, the tenth transistor M10 and the thirteenth transistor M13 remains on, thereby continuing to pull down the potentials of the pull-up node PU and of the output terminal Output of the touch shift register unit to low level potentials.

In the noise reduction period (such as the t5 period in FIG. 7), the first clock signal terminal CLK is inputted with a low level signal, and the second clock signal terminal CLKB is inputted with a high level signal. Thus, the eighth transistor M8 is turned on, and the potential of the pull-down control node PD_CN is a high level potential. The ninth transistor M9 is turned on, and the potential of the pull-down node PD is a high level potential. Therefore, the tenth transistor M10 and the thirteenth transistor M13 are turned on so that the pull-up node PU and the output terminal Output of the touch shift register unit are both connected with the low level input terminal VGL. Further, the seventh transistor M7 is turned on, and the output terminal Output of the touch shift register unit outputs a low level.

Repeating the operation processes of the pull-down retention period and of the noise reduction period after the t5 period, the output terminal of the touch shift register unit keeps outputting a low level signal until the input terminal Input is inputted with a high level again to let the first input voltage input terminal V1 charge the capacitor C. In the exemplary process, the first voltage input terminal V1 is inputted with a high level signal, the second voltage input terminal V2 is inputted with a low level signal, the fourth transistor M4 connects the first voltage input terminal V1 and the pull-up node PU in the precharge period of operation of the touch shift register unit 310, and the fifth transistor M5 is configured to connect the pull-up node PU and the second voltage input terminal V2 in the reset period of the touch shift register unit 310.

Further, in the above processes, it could be that the first voltage input terminal V1 is inputted with a low level signal, and the second input terminal V2 is inputted with a high level signal. The fifth transistor M5 connects the second voltage input terminal V2 and the pull-up node PU in the precharge period of operation of the touch shift register unit 310, and the fourth transistor M4 is configured to connect the first voltage input terminal V1 and the pull-up node PU in the reset period of operation of the touch shift register unit 310.

Figure 8:
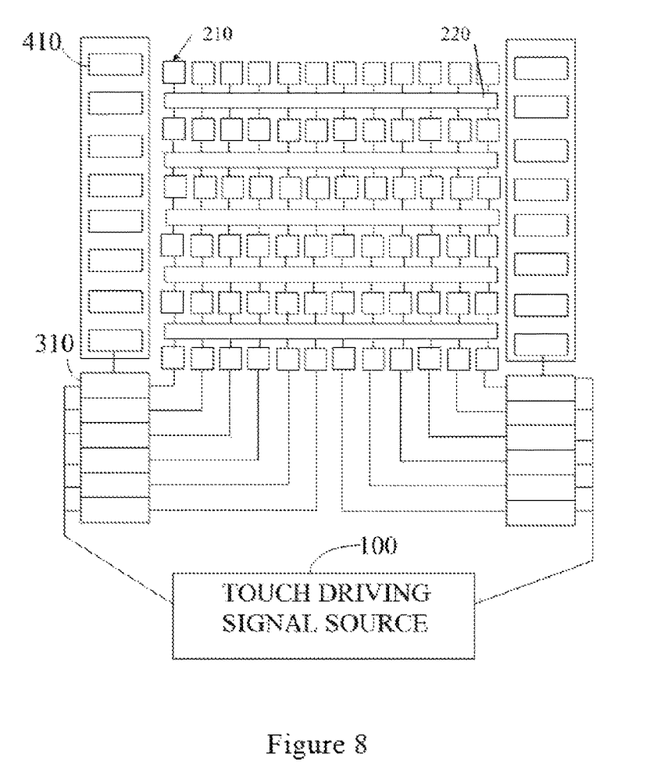
FIG. 8 is a schematic structural diagram of a display device according to an embodiment of the present disclosure.

FIG. 8 is a schematic structural diagram of a display device according to an embodiment of the present disclosure. As shown in FIG. 8, an embodiment of the present disclosure provides a display device. The display device includes a gate driving circuit, a touch driving circuit and a touch panel. The touch driving circuit is the above-described touch driving circuit provided by the embodiment of the present disclosure. The gate driving circuit includes a plurality of cascaded display shift register units 410, and the output terminal of the last one of the display shift register units 410 is connected to the input terminal of the first one of the touch shift register units 310 of the touch driving circuit.

For example, as shown in FIG. 8, the plurality of display shift register units 410 are divided into two columns, are provided on both sides of the touch panel, and may provide the scanning signal for gate lines on both sides, respectively. In an embodiment of the present disclosure, the plurality of touch shift register units 310 are divided into two columns, the input terminal of the first one of the touch shift register units 310 in the left column being connected to the output terminal of the last one of the display shift register units 410 in the left column, the input terminal of the first one of the touch shift register units 310 in the right column being connected to the output terminal of the last one of the display shift register units 410 in the right column. When N columns of touch driving electrodes 210 are provided on the touch panel, a plurality of touch shift register units 310 in the left column may correspond to N/2 columns of touch driving electrodes 210 on the touch panel from left to right, and a plurality of touch shift register units 310 in the right column may correspond to N/2 columns of touch driving electrodes 210 on the touch panel from right to left. Obviously, the plurality of display shift register units 410 of the gate driving circuit also may all be cascaded to form one column. And two columns of display shift register units 410 also may provide scanning signals for odd gate lines and even gate lines, respectively.

As shown in FIG. 8, the touch panel may further include a common electrode bar 220. The extending direction of the common electrode bar 220 and the extending direction of the touch driving electrodes 210 intersect, and the common electrode bar 220 and the touch driving electrodes 210 are insulated from one another. Each column of touch driving electrodes 210 includes a plurality of touch driving electrode blocks, and the touch driving electrode blocks and the common electrode bar 220 are provided in the same layer. In an embodiment of the present disclosure, the touch driving electrodes 210 are composed of a plurality of touch driving electrode blocks in series. For example, connecting lines provided in the other layer may be used to connect two adjacent touch driving electrode blocks through via holes, thereby implementing the connection of a plurality of spaced touch driving electrodes in series to one column of touch driving electrodes.

When the display device above-mentioned displays an image, one display period may be divided into a display phase and a touch phase. As shown in FIG. 8, in the display phase, a plurality of display shift register units 410 sequentially outputs scanning signals to a plurality of gate lines. The scanning in the display phase is completed after the last one of the display shift register units 410 outputs a scanning signal to the last gate line. Further, the output terminal of the last one of the display shift register units inputs a high level signal to the input terminal of the first one of the touch shift register units 310 so as to cause the plurality of touch shift register units 310 to sequentially output high level signals, so that a plurality of switching units are sequentially turned on, thereby making the touch driving signal source output touch driving signals to the corresponding touch driving electrodes through the turned on switching units. Since the plurality of touch shift register units sequentially output high levels and the corresponding plurality of switching units are sequentially turned on, the touch driving signal source may be connected with the driving signal input terminals of the plurality of switching units via the same driving signal transmission line, thereby implementing the sequential provision of touch driving signals to the plurality of touch driving electrodes, without setting up a plurality of driving signal transmission lines, thereby reducing the bezel space occupied by the driving signal transmission lines, conducive to the implementation of a narrow bezel of the display device.

In an embodiment of the present disclosure, in order to reduce the thickness of the touch display panel, simplify the manufacture for touch display panel and reduce the cost of touch display panel, a part of common electrodes are reused as the touch driving electrodes. In the display phase, voltage signals of all the common electrodes are the common voltage signal and in the touch phase, the signals in the common electrodes reused as the touch driving electrodes are the touch driving signal.

In the display phase, the touch driving electrodes are used as the common electrode, and signals on the touch driving electrodes and the common electrode bars are common signals. Specifically, the output terminals of the plurality of touch shift register units 310 output low level signals. The common signal of the common signal source is output to a plurality of columns of touch driving electrodes 210, and meanwhile may output a common signal to a plurality of common electrode bars 220, so that the signals on the common electrode bars 220 and the touch driving electrodes 210 are the common signal. Therefore, an electric field is generated between the common electrode bars and pixel electrodes as well as between the touch driving electrodes and the pixel electrodes, for image display.

In the touch phase, the plurality of touch shift register units 310 sequentially outputs high level signals. The touch driving signal source sequentially outputs touch driving signals to the plurality of touch driving electrodes for touch scanning. When the touch shift register unit 310 outputs a high level signal, the touch driving signal of the touch driving signal source 100 is outputted to the corresponding touch driving electrode 210. When the touch shift register unit 310 outputs a low level signal, the common signal source provides a common signal to the corresponding touch driving electrode 210, for preparing for the display phase of the next display period.

The phrase "In the display phase" may be a certain period within the display phase and may also be the entire display phase. When the display phase is a certain period of the display phase, the certain period may be the beginning period of inputting a frame beginning signal. Thus, the display control signal terminal may be a frame beginning signal terminal of the gate driving circuit. The frame beginning signal terminal provides a high level signal at the beginning period of a frame, so that the gate driving circuit begins to sequentially provide scanning signals to the plurality of gate lines. And in the embodiments shown in FIGS. 4 and 6, the third transistor M3 is turned on, and the common signal of the common signal source is outputted to the touch driving electrodes through the third transistor M3. Since the time of a frame is short, the signal on the touch driving electrode may be kept as the common signal until the output terminal of the touch shift register unit outputs a high level, and the touch driving signal of the touch driving signal source 100 is outputted to the touch driving electrodes through the switching units. Alternatively, a display control signal terminal connected to the timing control circuit is separately provided. The signal provided by the timing control circuit to the display control signal terminal is a high level signal in the display phase and a low level signal in the touch phase, to ensure that the third transistor M3 is turned on in the display phase, so that the signals of the touch driving electrodes remain as the common signal in the display phase.

Embodiments of the present disclosure provide a driving method of a display device, said display device being the above display device provided in the embodiments of the present disclosure, the driving method including: when the display device displays an image, in a display phase of each frame, a plurality of display shift register units sequentially scanning gate lines corresponding to the plurality of display shift register units, for displaying the frame, and in a touch phase of each frame, a touch driving signal source simultaneously providing touch driving signals to driving signal input terminals of the plurality of switching units, and when a plurality of touch shift register units sequentially output high level signals, the respective switching units corresponding to the plurality of touch shift register units providing touch driving signals to the corresponding touch driving electrodes. Specifically, in the embodiment of the present disclosure, in a beginning period of each frame, a frame beginning signal is provided to the input terminal of the first one of the display shift register units, so that the plurality of display shift register units scan the gate lines row by row, and in the touch phase of each frame, the plurality of touch shift register units sequentially outputting high levels in the touch phase. The touch driving signal source simultaneously provides touch driving signals to driving signal input terminals of the plurality of switching units, so that when the touch shift register unit outputs a high level, the driving signal input terminal and the driving signal output terminal of the switching unit are connected. Thus, one same driving signal transmission line may be used to connect the touch driving signal source and the plurality of switching units, and, for ease of driving, the touch driving signal source may continuously output touch driving signals in the time of a frame. In the above method, since in the display phase the plurality of touch shift register units outputs low level signals, the touch driving signal source is disconnected with the touch driving electrodes.

As shown in the embodiments of the present disclosure as shown in FIGS. 4 to 6, the switching unit includes a first transistor M1. The gate of the first transistor M1 forms a control terminal, and is connected to the output terminal of the touch shift register unit, a first electrode of the first transistor M1 forms a driving signal output terminal, a second electrode of the first transistor M1 forms a driving signal input terminal. In this case, the touch driving method includes: in the touch phase of each frame, controlling the touch driving signal source to simultaneously provide touch driving signals to the second electrodes of a plurality of first transistors M1, and when the touch shift register unit outputs a high level, connecting the first electrode and the second electrode of the first transistor M1 so as to output the touch driving signals provided by the touch driving signal source to the corresponding touch driving electrodes. In the embodiments shown in FIGS. 4 to 6 of the present disclosure, further, the touch driving circuit further includes a plurality of common signal output units 330 corresponding to a plurality of touch shift register units 310. The input terminal of the common signal output unit 330 is connected to the common signal source, and the output terminal of the common signal output unit is connected to the driving signal output terminal. In this case, the touch driving method further includes: controlling the common signal source to continuously output a common signal. When the output terminal of the touch shift register unit outputs a low level, the input terminal and output terminal of the common signal output unit are controlled to be connected. Therefore, in the display phase, the common signal of the common signal source is outputted to the touch driving electrodes such that voltages on the touch driving electrodes and on the common electrode bars are the same, thereby for image displaying.

In the embodiments of the present disclosure as shown in FIGS. 4 and 6, the common signal output unit 330 includes a second transistor M2 and a third transistor M3. The gate of the second transistor M2 is connected to the reset terminal Reset of the touch shift register unit, a first electrode of the second transistor M2 forms the output terminal of the common signal output unit and is connected to the driving signal output terminal, and a second electrode of the second transistor M2 forms the input terminal of the common signal output unit and is connected to the common signal source. The gate of the third transistor M3 is connected to the display control signal terminal, a first electrode of the third transistor M3 is connected to the driving signal output terminal, and a second electrode of the third transistor M3 is connected to the common signal source. In this case, the touch driving method further includes: in the display phase, providing a high level signal to the display control signal terminal.

As used herein, "in the display phase" may be a certain period within the display phase and may also be the entire display phase. For example, a high level signal is provided in the beginning phase of a frame, so as to turn on the third transistor M3 in the beginning period of a frame or in the entire display phase, so that the third transistor M3 is turned on in the entire display phase so as to input the common signal to the touch driving electrode, so that the signal on the touch driving electrode is kept as the common signal before the corresponding touch shift register unit outputs a high level signal.

In the embodiment of the present disclosure shown in FIG. 5, the touch shift register unit may include a first clock signal terminal CLK and a second clock signal terminal CLKB. The common signal output unit 330 includes a second transistor M2. The gate of the second transistor M2 is connected to the second clock signal terminal CLKB, a first electrode of the second transistor M2 is connected to the driving signal output terminal Tx_out, and a second electrode of the second transistor M2 is connected to the common signal source. In this case, the driving method further includes: providing clock signals opposite in phase to the first clock signal terminal CLK and the second clock signal terminal CLKB. Also, in the beginning period of a frame, a high level signal is provided to the second clock signal terminal CLKB. With the high level signal of the second clock signal terminal in the beginning period, the common signal of the common signal source may be outputted to the corresponding touch driving electrodes, so that the signals on the touch driving electrodes are kept as the common signal in the display phase, without the need to separately provide a drive signal to the second transistor M2 to control the turning on of the second transistor M2.

It may be appreciated that the above embodiments are merely exemplary embodiments to illustrate the principles of the present disclosure, but the present disclosure is not limited thereto. Those of ordinary skill in the art may make various modifications and improvements, without departing from the spirit and essence of the present disclosure, and these variations and modifications are also considered within the scope of the present disclosure.

What is claimed is:

1. A touch driving circuit for providing driving signals to touch driving electrodes of a touch panel in a touch phase, wherein the touch driving circuit comprises:
a plurality of cascaded touch shift register units, wherein the number of the touch shift register units is same as the number of columns of the touch driving electrodes, wherein the touch driving circuit further comprises a plurality of switching units corresponding to the plurality of touch shift register units, wherein the switching unit of the plurality of switching units comprises a driving signal input terminal, a control terminal, and a driving signal output terminal, wherein the control terminal of the switching unit is connected to an output terminal of the corresponding touch shift register unit, wherein the driving signal input terminal of the switching unit is connected to a touch driving signal source by a driving signal transmission line, wherein the driving signal output terminal of the switching unit is connected to the corresponding column of touch driving electrodes, and wherein, when the touch shift register unit of the plurality of touch shift register units outputs a high level signal, the switching unit connects the driving signal input terminal and the driving signal output terminal, wherein the touch driving circuit further comprises a plurality of common signal output units corresponding to the plurality of touch shift register units, wherein the input terminal of the common signal output unit is connected to a common signal source providing a common signal, wherein the output terminal of the common signal output unit is connected to the driving signal output terminal of the switching unit, and wherein the common signal output unit is configured to connect the common signal source and the driving signal output terminal when the output terminal of the touch shift register unit outputs a low level signal.

2. The touch driving circuit according to claim 1, wherein the switching unit comprises a first transistor, wherein the gate of the first transistor forms the control terminal, wherein a first electrode of the first transistor forms the driving signal output terminal, and wherein a second electrode of the first transistor forms the driving signal input terminal.

3. The touch driving circuit according to claim 1, wherein the common signal output unit comprises a second transistor and a third transistor, wherein the gate of the second transistor is connected to a reset terminal of the touch shift register unit, wherein a first electrode of the second transistor is connected to the driving signal output terminal, wherein a second electrode of the second transistor is connected to the common signal source, wherein the gate of the third transistor is connected to a display control signal terminal, wherein a first electrode of the third transistor is connected to the driving signal output terminal, wherein a second electrode of the third transistor is connected to the common signal source, and wherein the display control signal terminal is configured to provide a high level signal in a display phase.

4. The touch driving circuit according to claim 1, wherein the touch shift register unit comprises a first clock signal terminal and a second clock signal terminal, wherein clock signals of the first clock signal terminal and of the second clock signal terminal are opposite in phase, wherein the second clock signal terminal is configured to provide a high level signal in a beginning period of displaying of a frame, wherein the common signal output unit comprises a second transistor, wherein the gate of the second transistor is connected to the second clock signal terminal, wherein a first electrode of the second transistor is connected to the driving signal output terminal, and wherein a second electrode of the second transistor is connected to the common signal source.

5. The touch driving circuit according to claim 1, wherein the touch shift register unit comprises a first voltage input terminal, a second voltage input terminal, a fourth transistor, a fifth transistor, a pull-up module, a reset module, and a pull-down module,
wherein the gate of the fourth transistor is connected to an input terminal of the touch shift register unit, the first electrode of the fourth transistor is connected to the first voltage input terminal, and the connection point connecting the second electrode of the fourth transistor and the pull-up module forms a pull-up node,
wherein the gate of the fifth transistor is connected to the reset terminal of the touch shift register unit, the first electrode of the fifth transistor is connected to the pull-up node, and the second electrode of the fifth transistor is connected to the second voltage input terminal,
wherein the pull-up module is connected to the first clock signal terminal, the pull-up node, and the output terminal of the touch shift register unit respectively, and the pull-up module is configured to cause the output terminal of the touch shift register unit to output a high level signal in a pull-up period of operation of the touch shift register unit,
wherein a control terminal of the reset module is connected to the second clock signal terminal, an input terminal of the reset module is connected to a low level input terminal, an output terminal of the reset module is connected to the output terminal of the touch shift register unit, and the reset module is configured to reset the output terminal of the touch shift register unit in a reset period of operation of the touch shift register unit, and
wherein the pull-down module is connected to the second clock signal terminal, the pull-up node, the output terminal of the touch shift register unit and the low level input terminal respectively, the pull-down module configured to pull down potentials of the pull-up node and of the output terminal of the touch shift register unit in a pull-down retention period and a noise reduction period of operation of the touch shift register unit.

6. The touch driving circuit according to claim 5, wherein the pull-up module comprises a sixth transistor and a capacitor, wherein the gate of the sixth transistor is connected to the pull-up node, wherein a first electrode of the sixth transistor is connected to the first clock signal terminal, wherein a second electrode of the sixth transistor is connected to the output terminal of the touch shift register unit, wherein a first electrode of the capacitor is connected to the pull-up node, and wherein a second electrode of the capacitor is connected to the output terminal of the touch shift register unit.

7. The touch driving circuit according to claim 5, wherein the reset module comprises a seventh transistor, wherein the gate of the seventh transistor forms the control terminal of the reset module, wherein a first electrode of the seventh transistor forms the output terminal of the reset module, and wherein a second electrode of the seventh transistor forms the input terminal of the reset module.

8. The touch driving circuit according to claim 5, wherein the pull-down module comprises an eighth transistor, a ninth transistor, a tenth transistor, an eleventh transistor, a twelfth transistor, and a thirteenth transistor,
wherein the gate and a first electrode of the eighth transistor are both connected to the second clock signal terminal, and a second electrode of the eighth transistor is connected to the gate of the ninth transistor,
wherein a first electrode of the ninth transistor is connected to the second clock signal terminal, and the connection point connecting a second electrode of the ninth transistor, the gate of the tenth transistor, a first electrode of the twelfth transistor, and the gate of the thirteenth transistor forms a pull-down node,
wherein a first electrode of the tenth transistor is connected to the pull-up node, and a second electrode of the tenth transistor is connected to the low level input terminal,
wherein the gate of the eleventh transistor is connected to the pull-up node, a first electrode of the eleventh transistor is connected to the second electrode of the eighth transistor, and a second electrode of the eleventh transistor is connected to the low level input terminal,
wherein the gate of the twelfth transistor is connected to the pull-up node, and a second electrode of the twelfth transistor is connected to the low level input terminal, and
wherein a first electrode of the thirteenth transistor is connected to the output terminal of the touch shift register unit, and a second electrode of the thirteenth transistor is connected to the low level input terminal.

9. The touch driving circuit according to claim 5, wherein the first one of the touch shift register units further comprises:
a loop input module, wherein the control terminal of the loop input module is connected to the output terminal of the last one of the touch shift register units, wherein the output terminal of the loop input module is connected to the pull-up node of the first one of the touch shift register units, and wherein the loop input module is configured to charge the pull-up module of the first one of the touch shift register units according to the output voltage of the last one of the touch shift register units, and
a touch OFF module configured to cause the first one of the touch shift register units to output a low level signal in the display phase.

10. The touch driving circuit according to claim 9, wherein the loop input module comprises a fourteenth transistor, wherein the gate of the fourteenth transistor is connected to the output terminal of the last one of the touch shift register units, wherein a first electrode of the fourteenth transistor is connected to the first voltage input terminal at which a high level signal is inputted, and wherein a second electrode of the fourteenth transistor is connected to the pull-up node of the first one of the touch shift register units.

11. The touch driving circuit according to claim 9, wherein the control terminal of the touch OFF module is connected to a frame beginning signal terminal configured to provide a high level signal in the beginning period of displaying of a frame, wherein an output terminal of the touch OFF module is connected to the pull-up node of the first one of the touch shift register units, wherein an input terminal of the touch OFF module is connected to the second voltage input terminal inputted with a low level signal, and wherein the touch OFF module connects the pull-up node and the second voltage input terminal in the display phase.

12. The touch driving circuit according to claim 11, wherein the touch OFF module comprises a fifteenth transistor, wherein the gate of the fifteenth transistor forms the control terminal of the touch OFF module, wherein a first electrode of the fifteenth transistor forms the output terminal of the touch OFF module, and wherein a second electrode of the fifteenth transistor forms the input terminal of the touch OFF module.

13. A display device comprising a gate driving circuit, a touch driving circuit and a touch panel, wherein the touch driving circuit is the touch driving circuit according to claim 1, wherein the gate driving circuit comprises a plurality of cascaded display shift register units, and wherein the output terminal of the last one of the display shift register units is connected to the input terminal of the first one of the touch shift register units of the touch driving circuit.

14. The display device according to claim 13, wherein the touch panel comprises a common electrode bar, wherein the extending direction of the common electrode bar and the extending direction of the touch driving electrodes intersect, wherein the common electrode bar and the touch driving electrodes are insulated from one another, wherein each column of the touch driving electrodes comprises a plurality of touch driving electrode blocks, and wherein the touch driving electrode blocks and the common electrode bar are provided in the same layer.

15. A driving method for the driving device according to claim 13, comprising:
when the display device performs image displaying, in the display phase of each frame, sequentially scanning, using the plurality of display shift register units, gate lines corresponding to the plurality of display shift register units so as to display the frame, and
in a touch phase of each frame, concurrently providing, using the touch driving signal source, touch driving signals to driving signal input terminals of the plurality of switching units, wherein when the plurality of touch shift register units sequentially output high level signals, the respective switching units corresponding to the plurality of touch shift register units provide the touch driving signals to the corresponding touch driving electrodes.

16. The driving method according to claim 15, wherein the switching unit comprises a first transistor, wherein the gate of the first transistor forms the control terminal, wherein a first electrode of the first transistor forms the touch driving signal output terminal, wherein a second electrode of the first transistor forms the touch driving signal input terminal, and wherein in the touch driving method, in the touch phase of each frame, when the corresponding touch shift register unit outputs a high level signal, the first electrode and the second electrode of the first transistor are connected.

17. The driving method according to claim 15, wherein the touch driving circuit further comprises a plurality of common signal output units corresponding to the plurality of touch shift register units, wherein the input terminal of the common signal output unit is connected to the common signal source, wherein the output terminal of the common signal output unit is connected to the driving signal output terminal, and wherein the touch driving method further comprises:
controlling the common signal source to continuously output a common signal, and
when the output terminal of the touch shift register unit outputs a low level, controlling the input terminal and output terminal of the common signal output unit to be connected.

18. The driving method according to claim 17, wherein the common signal output unit comprises a second transistor and a third transistor,
wherein the gate of the second transistor is connected to the reset terminal of the touch shift register unit, a first electrode of the second transistor forms the output terminal of the common signal output unit and is connected to the driving signal output terminal, and a second electrode of the second transistor forms the input terminal of the common signal output unit and is connected to the common signal source,
wherein the gate of the third transistor is connected to a display control signal terminal, a first electrode of the third transistor is connected to the driving signal output terminal, and a second electrode of the third transistor is connected to the common signal source, and
wherein the touch driving method further comprises in the display phase, providing a high level signal to the display control signal terminal.

19. The driving method according to claim 17, wherein the touch shift register unit comprises a first clock signal terminal and a second clock signal terminal,
wherein the common signal output unit comprises a second transistor, the gate of the second transistor is connected to the second clock signal terminal, a first electrode of the second transistor forms the output terminal of the common signal output unit and is connected to the driving signal output terminal, and a second electrode of the second transistor forms the input terminal of the common signal output unit and is connected to the common signal source, and
wherein the driving method further comprises providing clock signals opposite in phase to the first clock signal terminal and the second clock signal terminal, and in the pull-up period of operation of the touch shift register unit, providing a low level signal to the second clock signal terminal.

* * * * *